United States Patent
Tochitani

(10) Patent No.: US 11,451,141 B2
(45) Date of Patent: Sep. 20, 2022

(54) DC POWER SUPPLY DEVICE, CURRENT STABILIZING CIRCUIT FOR DC POWER SUPPLY DEVICE, AND METHOD FOR REDUCING NOISE OF POWER-SUPPLY LINE

(71) Applicant: Koji Tochitani, Atsugi (JP)

(72) Inventor: Koji Tochitani, Atsugi (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/325,540

(22) Filed: May 20, 2021

(65) Prior Publication Data

US 2021/0376722 A1 Dec. 2, 2021

(30) Foreign Application Priority Data

May 28, 2020 (JP) .............................. JP2020-093471

(51) Int. Cl.
| | |
|---|---|
| *H02M 3/155* | (2006.01) |
| *H02M 1/44* | (2007.01) |
| *H02M 3/158* | (2006.01) |
| *H03F 3/45* | (2006.01) |
| *H02M 1/00* | (2006.01) |
| *H02M 1/15* | (2006.01) |

(52) U.S. Cl.
CPC ............ *H02M 3/155* (2013.01); *H02M 1/44* (2013.01); *H02M 3/158* (2013.01); *H02M 1/007* (2021.05); *H02M 1/0045* (2021.05); *H02M 1/15* (2013.01); *H03F 3/45475* (2013.01)

(58) Field of Classification Search
CPC ......... H02M 3/155–1588; H02M 1/44; H02M 3/158; H02M 1/0045; H02M 1/007; H02M 1/15; H03F 3/45475
See application file for complete search history.

(56) References Cited

U.S. PATENT DOCUMENTS

| | | | | |
|---|---|---|---|---|
| 4,041,247 A | * | 8/1977 | Briley ................. | H04M 1/6008 379/395.01 |
| 4,633,379 A | * | 12/1986 | Oda ...................... | H02M 3/156 363/19 |
| 4,716,358 A | * | 12/1987 | Fucito .................... | G05F 1/561 323/349 |
| 5,477,132 A | * | 12/1995 | Canter ..................... | H02J 7/35 320/101 |

(Continued)

FOREIGN PATENT DOCUMENTS

| | | |
|---|---|---|
| EP | 3506475 A1 | 7/2019 |
| JP | 2006262121 A | 9/2006 |

(Continued)

OTHER PUBLICATIONS

Extended European Search Report (EESR) dated Oct. 11, 2021, issued in counterpart European Application No. 21174674.8.

*Primary Examiner* — Yusef A Ahmed
(74) *Attorney, Agent, or Firm* — Holtz, Holtz & Volek PC

(57) ABSTRACT

A DC power supply device includes a switching power supply and a current stabilizing circuit connected in a pre-stage or a post-stage of the switching power supply. The DC power supply voltage device is configured to receive an input DC voltage from a DC power source via a power-supply line, convert the input DC voltage into a different DC voltage, and output the converted DC voltage.

10 Claims, 4 Drawing Sheets

(56) References Cited

U.S. PATENT DOCUMENTS

| | | | | |
|---|---|---|---|---|
| 6,150,802 A * | 11/2000 | Andrews | H02M 3/156 | 323/282 |
| 6,771,119 B2 * | 8/2004 | Ochi | H02M 1/15 | 327/552 |
| 8,872,497 B2 * | 10/2014 | Nakashima | H02M 1/14 | 323/288 |
| 9,952,610 B1 * | 4/2018 | Yokoyama | G05F 1/468 | |
| 10,536,082 B2 * | 1/2020 | Imade | H05B 45/395 | |
| 10,566,936 B1 * | 2/2020 | Wessendorf | H03F 1/301 | |
| 11,005,365 B2 * | 5/2021 | Romeo | H02M 3/156 | |
| 2003/0137286 A1 * | 7/2003 | Kimball | H02M 3/1584 | 323/271 |
| 2004/0030229 A1 * | 2/2004 | Norris | A61B 5/14552 | 600/323 |
| 2004/0095105 A1 * | 5/2004 | Nakata | G05F 1/56 | 323/280 |
| 2004/0150265 A1 * | 8/2004 | Gotzenberger | H02M 3/156 | 307/11 |
| 2004/0204173 A1 * | 10/2004 | Liu | H02M 3/156 | 455/572 |
| 2005/0007089 A1 * | 1/2005 | Niiyama | H02M 3/1582 | 323/284 |
| 2005/0052168 A1 * | 3/2005 | Tazawa | H02M 3/1584 | 323/282 |
| 2005/0057300 A1 * | 3/2005 | Ishii | H02M 3/07 | 327/536 |
| 2005/0212501 A1 * | 9/2005 | Acatrinei | G05F 1/70 | 323/283 |
| 2006/0044062 A1 * | 3/2006 | Kojima | H03F 1/34 | 330/253 |
| 2006/0226822 A1 * | 10/2006 | Xu | H02M 3/1588 | 323/283 |
| 2007/0108947 A1 * | 5/2007 | Liao | H02M 3/156 | 323/222 |
| 2007/0252567 A1 * | 11/2007 | Dearn | H02M 3/156 | 323/282 |
| 2007/0262757 A1 * | 11/2007 | Kawagoshi | H02M 1/10 | 323/265 |
| 2009/0284237 A1 * | 11/2009 | Kitagawa | H02M 3/156 | 323/282 |
| 2010/0283441 A1 * | 11/2010 | Wang | H02M 1/14 | 323/282 |
| 2011/0062929 A1 * | 3/2011 | Strydom | H02M 3/158 | 323/284 |
| 2011/0267020 A1 * | 11/2011 | Granat | H02M 3/1588 | 323/284 |
| 2011/0278925 A1 * | 11/2011 | Sato | H02M 3/33523 | 307/31 |
| 2013/0301317 A1 * | 11/2013 | Ishii | H02M 1/4225 | 363/44 |
| 2014/0252969 A1 * | 9/2014 | Wang | H05B 45/50 | 315/200 R |
| 2014/0266120 A1 * | 9/2014 | Isham | H02M 3/157 | 323/283 |
| 2014/0292288 A1 * | 10/2014 | Yan | H02M 3/156 | 323/234 |
| 2014/0292300 A1 * | 10/2014 | Yan | H02M 3/156 | 323/288 |
| 2015/0061614 A1 * | 3/2015 | Cohen | H05B 45/38 | 323/271 |
| 2016/0072385 A1 * | 3/2016 | Torres | H02M 3/156 | 323/282 |
| 2016/0141957 A1 * | 5/2016 | Ozawa | H02M 3/156 | 323/271 |
| 2016/0164412 A1 * | 6/2016 | Li | G01R 31/40 | 323/299 |
| 2016/0248381 A1 * | 8/2016 | Yang | H03F 3/245 | |
| 2017/0070143 A1 * | 3/2017 | Lee | H02M 3/157 | |
| 2018/0178710 A1 * | 6/2018 | Ichikawa | H05B 45/10 | |
| 2020/0044575 A1 * | 2/2020 | Nagano | H02M 3/33592 | |
| 2020/0120767 A1 * | 4/2020 | Ichikawa | H05B 45/345 | |
| 2021/0111638 A1 * | 4/2021 | Araumi | H02M 1/44 | |
| 2021/0159787 A1 * | 5/2021 | Gibson | H02M 3/158 | |
| 2021/0249998 A1 * | 8/2021 | Parupalli | H03F 1/56 | |
| 2021/0391836 A1 * | 12/2021 | Gupta | H03F 3/3035 | |

FOREIGN PATENT DOCUMENTS

| | | |
|---|---|---|
| JP | 2010207013 A | 9/2010 |
| WO | 0209268 A1 | 1/2002 |

\* cited by examiner

DC POWER SUPPLY DEVICE, CURRENT STABILIZING CIRCUIT FOR DC POWER SUPPLY DEVICE, AND METHOD FOR REDUCING NOISE OF POWER-SUPPLY LINE

CROSS-REFERENCE TO RELATED APPLICATIONS

The entire disclosure of Japanese Patent Application No. 2020-093471 filed on May 28, 2020 is incorporated herein by reference in its entirety.

BACKGROUND

Technical Field

The present disclosure relates to a DC power supply device that applies DC voltage to a load, a current stabilizing circuit for the DC power supply device, and a method for reducing noise of a power-supply line. More specifically, the present disclosure relates to a technology effectively applicable to, for example, a system that supplies DC voltage from a battery to a load via a relatively long power-supply line, such as a cable.

Background Art

A system, such as a drive recorder, uses relatively long power-supply cables to apply DC voltage from a battery to a load. The load (device) of such a system may include a switching power supply (DC-DC converter) to prevent voltage drops and to improve efficiency. Switching operation of the switching power supply, however, may cause the long power-supply cables, which send current from the battery to the switching power supply, to emit radiated noise. The noise may affect other electronic devices, such as a TV broadcast receiver.

To reduce radiated noise emitted by power-supply lines, there is known a technology of putting a ferrite-bead inductor to power-supply lines. For example, JP2006-262121A discloses a technology for electronic devices that require countermeasures against noise, such as a digital amplifier incorporated in an audio-visual system. According to the technology, noise is reduced by connecting a large capacitor and a small capacitor to the power-supply line of the class-D amplifier driver such that the large and small capacitors are connected in parallel and by connecting a ferrite bead between the capacitors.

There is also a technology for reducing radiated noise by shielding cables. However, an onboard system that includes an electronic device, such as a drive recorder, tends to have a large amount of cables. Shielding cables of such a system increases cost and weight, and therefore may not be appropriate as a means of reducing noise.

SUMMARY

In the system that uses relatively long power-supply cables to supply DC voltage to the load and that includes a DC power supply device (DC-DC converter) at the load side, switching operation by the DC-DC converter causes great fluctuations of current flowing through the power-supply cables. The current fluctuations cause radiated noise. A ferrite bead, which normally has impedance of several hundred Ω, inserted in the middle of the power-supply cable may not effectively restrain transmission of the current fluctuations to the upstream and therefore may not contribute sufficient noise reduction. Further, selecting an optimum bead requires complicated and heavy design work. When reconsideration and replacement of parts to be used are necessary, further work and time are required.

A conventional DC power supply device that converts battery power-supply voltage into voltage applicable to an electronic device (load) uses either a switching DC-DC converter or a linear regulator, such as a series regulator. A linear regulator has an advantage of not producing noise and a disadvantage of being inefficient and generating much heat. A DC-DC converter has an advantage of being efficient and a disadvantage of producing noise. These converters/regulators are therefore used for different purposes. More specifically, the linear regulator is used when noise reduction is prioritized, and the DC-DC converter is used when efficiency is prioritized.

The inventor of the present invention considered whether radiated noise of the power-supply cables is reduced by placing a linear regulator in the upstream of a DC-DC converter, which produces switching noise. Upon detailed examination, the inventor found that the above configuration can reduce radiated noise of the power-supply cables to some extent but have disadvantages. Such disadvantages include: (i) change in battery voltage greatly affects efficiency, (ii) the servo band of the regulator needs to be increased to obtain sufficient noise reduction effect, whereas the increase of the servo band makes the regulator more likely to oscillate, (iii) the optimum capacitance of the input capacitor of the DC-DC converter is often different from the optimum capacitance of the output capacitor of the linear regulator, and the difference may cause troubles, such as oscillation or increase of ripple current.

The inventor further considered whether placing the linear regulator in the downstream of the DC-DC converter could reduce the radiated noise of the power-supply cables. In the known art, JP2010-207013A discloses connecting the regulator in the post-stage of the DC-DC converter. The invention disclosed in JP2010-207013A, however, does not aim to reduce radiated noise from the power-supply lines but aims to prevent generation of rush current flowing into the large-capacitance capacitor provided between the output terminal of the DC-DC converter and the load. Thus, the known art of connecting the regulator in the post-stage of the DC-DC converter may not yield sufficient radiated-noise reduction effect.

The present invention has been conceived in view of the above issues. Objects of the present invention include providing: a DC power supply device that can reduce, in a system that uses a relatively long power-supply line to supply DC voltage from the battery to the load, radiated noise of the power-supply lines; a current stabilizing circuit used for the DC power supply device; and a method for reducing noise of the power-supply line.

The objects of the present invention further include providing: a DC power supply device that can reduce radiated noise of the power-supply line without changing efficiency due to change in battery voltage or causing the regulator to be more likely to oscillate or increasing ripple current; a current stabilizing circuit for the DC power supply device; and a method for reducing noise of the power-supply line.

To achieve at least one of the abovementioned objects, according to an aspect of the present invention, there is provided a DC power supply device including: a switching power supply; and a current stabilizing circuit connected in a pre-stage or a post-stage of the switching power supply, wherein the DC power supply voltage device is configured to receive an input DC voltage from a DC power source via a power-supply line, convert the input DC voltage into a different DC voltage, and output the converted DC voltage.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, embodiments of the present invention are described with reference to the drawings.

Figure 1:
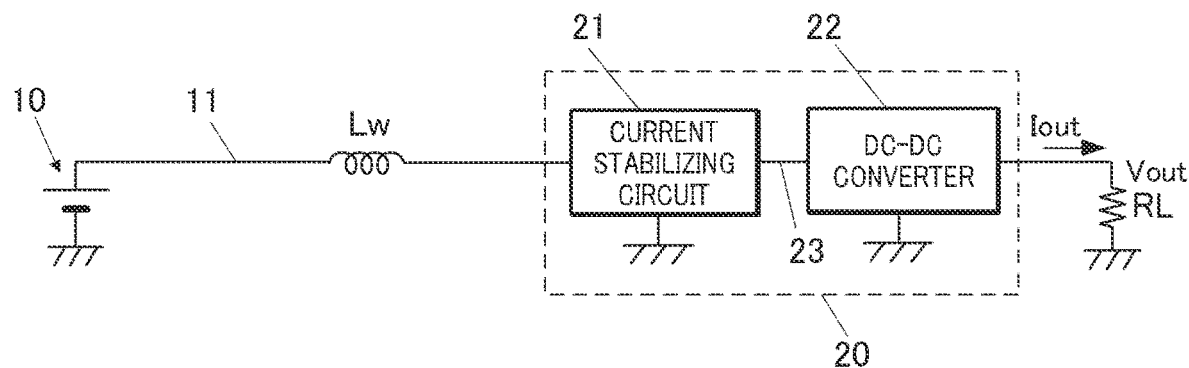
FIG. 1 shows system configuration of an embodiment of a power supply system that includes a DC power supply device of the present invention.

FIG. 1 shows schematic configuration of an embodiment of a power supply system that includes a DC power supply device of the present invention. The power supply system supplies power-supply voltage from a DC power source, such as a battery, to a load via power-supply cables.

The power supply system in FIG. 1 supplies power-supply voltage of a battery 10 to a DC power supply device 20 in this embodiment via a power-supply cable 11. The DC power supply device 20 converts the input voltage into voltage applicable to an electronic device (load) and outputs the converted stable voltage as output voltage Vout, thereby sending current Iout to the load. In FIG. 1, Lw is the inductance component of the power-supply cable 11, and RL is the equivalent resistance (load resistance) of the electronic device as a load.

The DC power supply device 20 in this embodiment includes: a current stabilizing circuit 21 that regulates current coming from the battery 10 via the power-supply cable 11; and a switching DC-DC converter 22 provided in the post-stage of the current stabilizing circuit 21. When the current stabilizing circuit 21 and the DC-DC converter 22 are formed on a single board, such as a printed circuit board, the current stabilizing circuit 21 and the DC-DC converter 22 are connected by power-supply lines 23 consisting of two printed wiring patterns formed on the board. The present invention, however, is not limited to the above structure. The power-supply cable 11 includes a coaxial cable, such as a power-over-coax (PoC) cable that sends signals and power simultaneously.

A typical coaxial cable is a shielded cable and therefore does not need to suppress conductive noise. The PoC cable, on the other hand, needs to suppress conductive noise because the PoC cable simultaneously supplies power and communication signals, such as digital image signals. Conventionally, the suppression of conductive noise has been done by using a filter consisting of an inductor and a capacitor, for example. According to the present invention, the DC power supply device does not require such a filter to be connected to the PoC cable.

Figure 2:
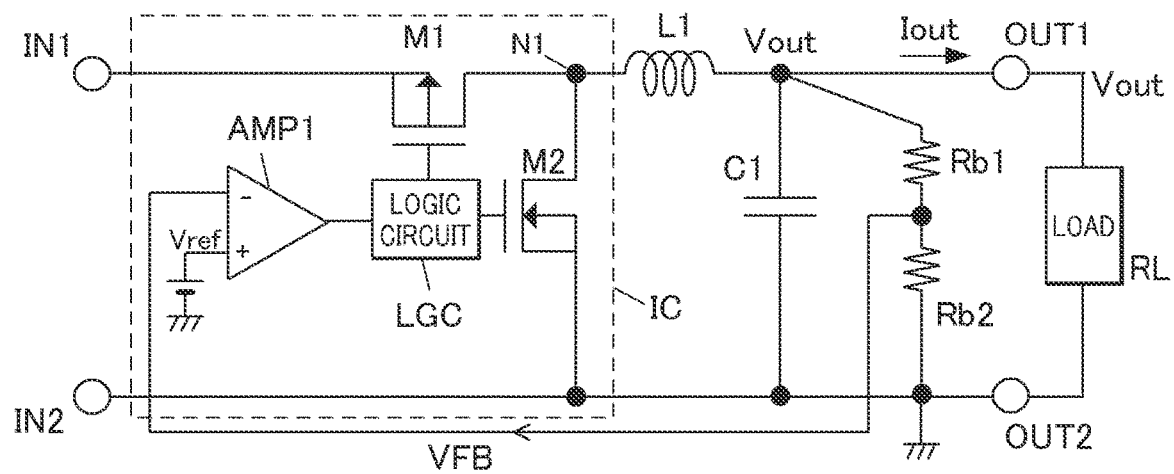
FIG. 2 shows a detailed example of circuit configuration of an example DC-DC converter as a switching power supply that constitutes the power supply system in FIG. 1.

FIG. 2 shows a detailed circuit example of the DC-DC converter 22. As shown in FIG. 2, the DC-DC converter 22 in this embodiment includes a pair of voltage-input terminals IN1, IN2 and a pair of voltage-output terminals OUT1, OUT2. The voltage-input terminals IN1, IN2 are connected to the power-supply lines 23 shown in FIG. 1. The voltage-output terminals OUT1, OUT2 are connected to a load RL. The voltage-input terminal IN2 and the voltage-output terminal OUT2 are connected to each other and to a grounding point. Between the voltage-output terminals OUT1, OUT2 (grounding point), a capacitor C1 is connected for smoothing. Further, between the voltage-output terminals OUT1, OUT2 (grounding point), bleeder resistors Rb1, Rb2 are connected in series to divide output voltage Vout of the DC-DC converter 22.

The DC-DC converter 22 further includes a switching transistor M1 and an inductor L1. The switching transistor M1 is a switching element consisting of a P-channel metal oxide semiconductor (MOS) field effect transistor (FET) and is connected in series between the voltage-input terminal IN1 and the voltage-output terminal OUT1. The DC-DC converter 22 further includes a synchronous rectification transistor M2, a logic circuit LGC, and an error amplifier AMP1. The synchronous rectification transistor M2 is connected between the voltage-output terminal OUT2 (grounding point) and a connecting node N1 that connects the switching transistor M1 and the inductor L1. The logic circuit LGC is a switching control circuit that generates signals for on-off control of the transistors M1, M2. The error amplifier AP1 is connected to an inverting input terminal that receives feedback voltage VFB that is the voltage divided by the bleeder resistors Rb1, Rb2.

The non-inverting input terminal of the error amplifier AMP1 receives reference voltage Vref. The error amplifier AMP1 outputs, to the logic circuit LGC, voltage that corresponds to the potential difference between the feedback voltage VFB and the reference voltage Vref. In accordance with the voltage output by the error amplifier AMP1, the logic circuit LGC controls time during which the switching transistor M1 is on. More specifically, the logic circuit LGC turns on the switching transistor M1 and turns off the synchronous rectification transistor M2 to send current to the inductor L1 to accumulate energy. The logic circuit LGC then turns off the switching transistor M1 and turns on the synchronous rectification transistor M2 to release the accumulated energy of the inductor L1 to send the current Iout to the voltage-output terminal OUT1. The logic circuit LGC also converts the input voltage to supply DC voltage to the load.

For the on-off control of the switching transistors M1, M2 by the logic circuit LGC in the DC-DC converter 22 in this embodiment, various control methods have been proposed, such as a method disclosed in JP2012-139023A. The logic circuit LGC of the DC-DC converter 22 in this embodiment can be configured according to a known control method, and description of a specific example thereof is omitted.

The transistors M1, M2, the logic circuit LGC, and the error amplifier AMP1 may be formed as a semiconductor integrated circuit (IC) on a single semiconductor chip.

Figure 3:
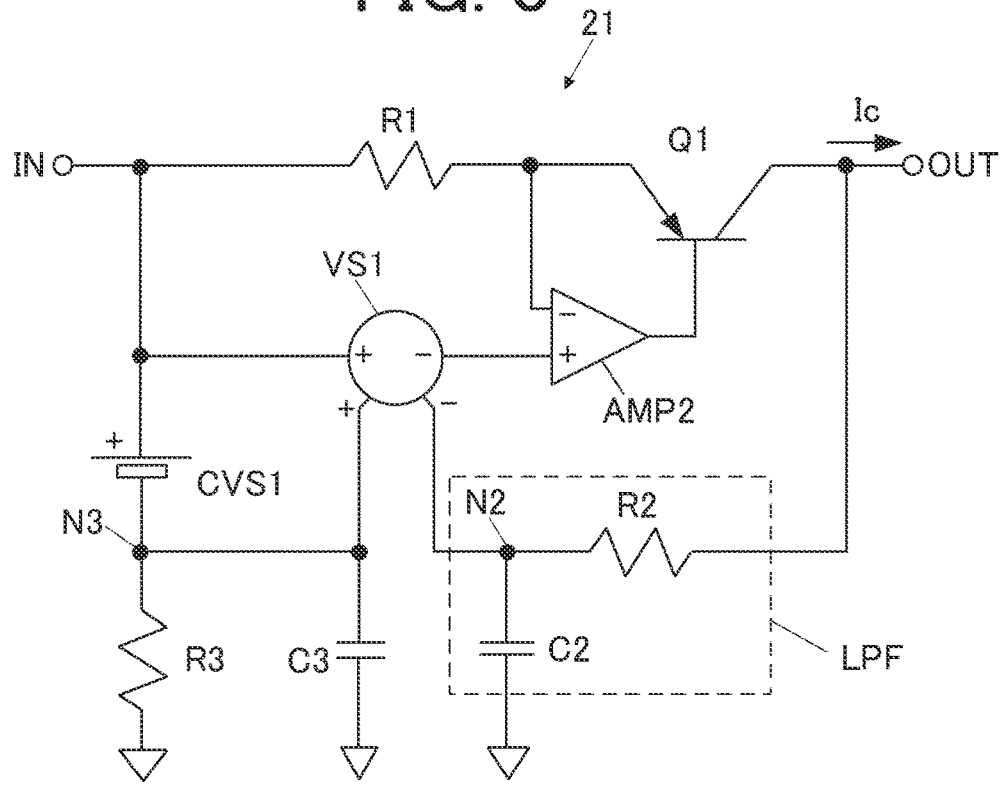
FIG. 3 shows circuit configuration of a first embodiment of a current stabilizing circuit that constitutes the power supply system in FIG. 1.

FIG. 3 shows a first embodiment of the current stabilizing circuit 21. As shown in FIG. 3, the current stabilizing circuit 21 in the first embodiment includes a current-control transistor Q1, a resistor R1, an operational amplifier (operational amplifier circuit) AMP2, and a voltage-control voltage source circuit VS1. The current-control transistor Q1 is a PNP bipolar transistor placed between a current-input terminal IN and a current-output terminal OUT. To the current-input terminal IN, DC voltage is applied by the battery 10 via the power-supply cable 11. The resistor R1 is connected between the current-input terminal In and the emitter terminal of the current-control transistor Q1. The operational amplifier AMP2 controls the current-control transistor Q1. The voltage-control voltage source circuit VS1 generates voltage to be applied to a non-inverting input terminal of the operational amplifier AMP2. As the resistor R1, an element having a low resistance of around 10 Ω is used.

The current stabilizing circuit 21 further includes a low-pass filter LPF that is provided between the current-output terminal OUT and the negative control terminal (−) of the voltage-control voltage source circuit VS1.

The voltage-control voltage source circuit VS1 includes a pair of control terminals (+), (−) and a pair of output terminals. The voltage-control voltage source circuit VS1 generates, between the output terminals, the voltage that corresponds to the potential difference between the control terminals (+), (−). Accordingly, in the first embodiment, the non-inverting input terminal of the operational amplifier AMP2 receives voltage that is lower than the electric potential of the current-input terminal IN by the voltage corresponding to the potential difference between the control terminals (+), (−). The voltage-control voltage source circuit VS1 may be a known voltage-control voltage source consisting essentially of an operational amplifier and a transistor, for example.

The low-pass filter LPF includes a resistor R2 and a capacitor C2. The resistor R2 is connected between the current-output terminal OUT of the current stabilizing circuit 21 and the negative control terminal (−) of the voltage-control voltage source circuit VS1. The capacitor C2 is connected between the negative control terminal (−) of the voltage-control voltage source circuit VS1 and a grounding point. The time constant of the low-pass filter LPF is set such that the low-pass filter LPF removes, among voltage fluctuation components of the current-output terminal OUT, high-frequency components that correspond to the switching frequency of the DC-DC converter 22 in the post-stage and passes low-frequency components that correspond to the servo band (servo control frequency) of the DC-DC converter 22.

Accordingly, the low-pass filter LPF operates so as to transmit, to the operational amplifier AMP2 via the voltage-control voltage source circuit VS1, only the voltage fluctuations of the current-output terminal OUT caused by the servo control of the DC-DC converter 22 in the post-stage. On the other hand, the low-pass filter LPF operates so as not to transmit, to the operational amplifier AMP2, the voltage fluctuations of the current-output terminal OUT caused by the switching control. More specifically, for example, when the switching frequency of the DC-DC converter 22 is 2 MHz and the servo-control frequency is 2.4 MHz, the resistor R2 is an element having a resistance more than 10 kΩ and less than 20 kΩ, and the capacitor C2 is an element having a capacitance of less than 10 nF. The servo control of the current stabilizing circuit 21 is performed on the basis of the band of the operational amplifier, the resistor R1, the capacitor of the output terminal of the current stabilizing circuit 21, and so forth, as well as the low-pass filter LPF. The low-pass filter LPF forms a second pole and affects phase margin predominantly rather than the band.

Between the current-input terminal IN of the current stabilizing circuit 21 and a grounding point, a constant voltage source CVS1 and a resistor R3 are connected in series. Further, a capacitor C3 for reducing noise is connected between the positive control terminal (+) of the voltage-control voltage source circuit VS1 and a grounding point. The positive control terminal (+) of the voltage-control voltage source circuit VS1 receives the electric potential of the connecting node N3 that connects the constant voltage source CVS1 and the resistor R3. More specifically, the resistor R3 is an element having a resistance of less than 10 MΩ, and the capacitor C3 is an element having capacitance of less than 10 μF.

The current stabilizing circuit 21 configured as described above operates so as to stabilize electric potentials of the current-input terminal IN of the current stabilizing circuit 21 and the positive control terminal (+) of the voltage-control voltage source circuit VS1 and to maintain low-frequency components of a potential difference between the current-input terminal IN and the current-output terminal OUT.

Figure 4:
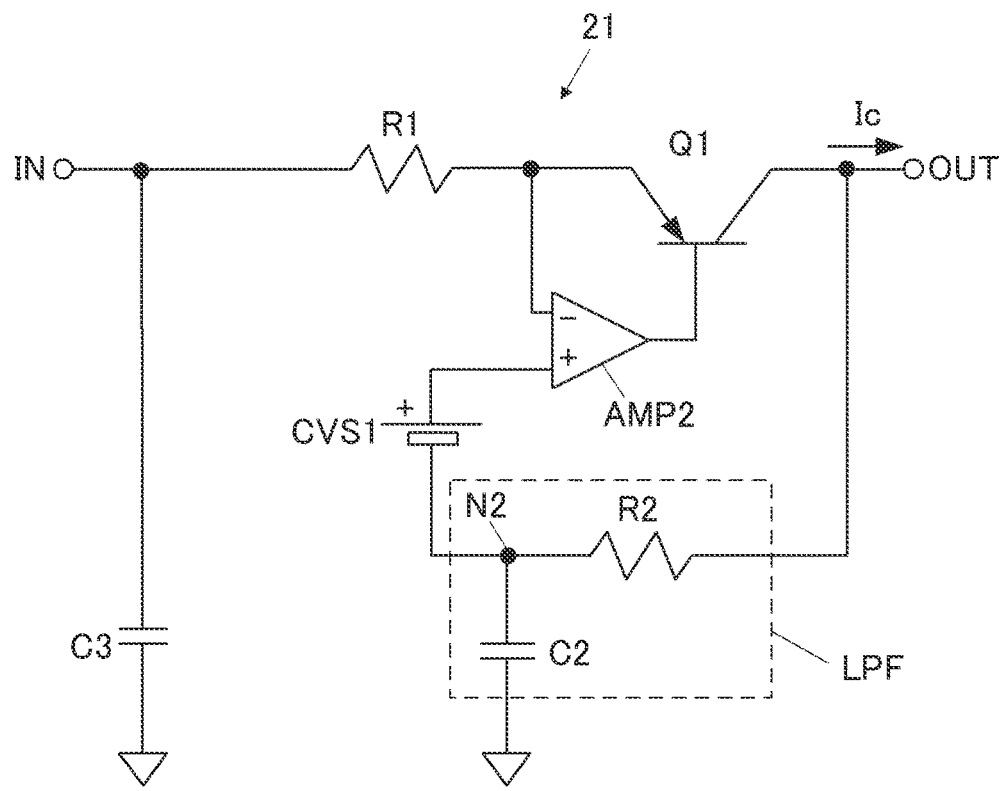
FIG. 4 shows a simplified example of circuit configuration of the current stabilizing circuit.
Figure 5:
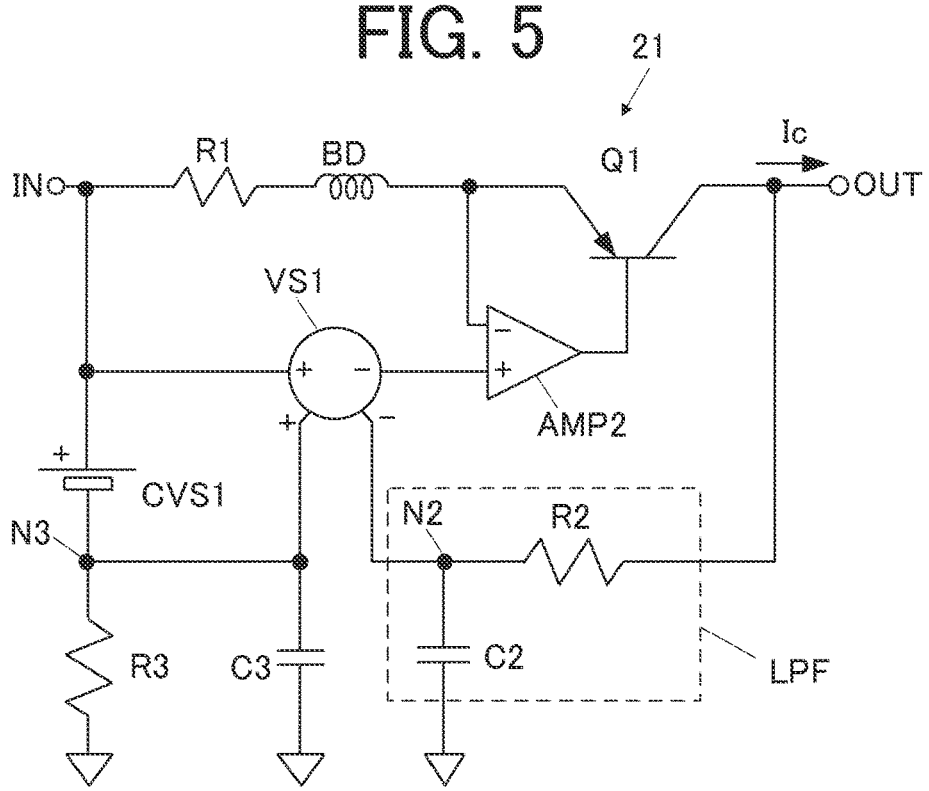
FIG. 5 shows an example of circuit configuration of the current stabilizing circuit that includes a bead.

FIG. 4 shows a simplified modification of the current stabilizing circuit 21 in FIG. 3. In this modification, only the capacitor C3 is connected between the current-input terminal IN of the current stabilizing circuit 21 and the grounding point, and the constant voltage source CVS1 is connected between the non-inverting input terminal of the operational amplifier AMP2 and the low-pass filter LPF. The noise reduction effect of this modification is slightly lower (by a few dB) but is substantially equal to the noise reduction effect of the current stabilizing circuit in FIG. 3. FIG. 5 shows another modification of the current stabilizing circuit in FIG. 3. In the modification, a bead BD is additionally connected in series to the resistor R1. The additional bead BD can improve the noise reduction effect by approximately 30 dB.

The constant voltage source CVS1 is configured to generate voltage that corresponds to the voltage VCE between the collector and the emitter of the bipolar transistor Q1 (approximately 0.2 V). Such a configuration allows the bipolar transistor Q1 to be active at all times. Further, generating the small voltage of around 0.2 V can reduce heat loss of the bipolar transistor Q1 so that the total loss of the transistor is minimized. On the other hand, the voltage of the constant voltage source CVS1 is regulated not to be too small to avoid increasing the parasitic capacitance of the bipolar transistor Q1.

The current stabilizing circuit 21 configured as described above in this embodiment operates so as to send current expressed by the following formula: $Ic=(\Delta V-CVS1)/R1$, where Ic is collector current that flows through the current-control transistor Q1, and $\Delta V$ is the potential difference between the current-input terminal IN and the current-output terminal OUT.

The potential difference $\Delta V$ between the current-input terminal IN and the current-output terminal OUT is regulated such that the high-frequency components due to the operation of the DC-DC converter 22 are removed and the low-frequency components are maintained, as described above. The current stabilizing circuit 21 therefore can send the current Ic that fluctuates according to current fluctuations due to the servo control of the DC-DC converter 22, while not transmitting, to the upstream power-supply cable 11, great current fluctuations due to the switching operation of the DC-DC converter 22 at the current-output terminal OUT side.

The DC power supply device 20 in this embodiment generates DC voltage using the DC-DC converter 22 and applies the generated voltage to the device (load), as described above. The DC power supply device 20 can therefore have an improved conversion efficiency as compared with a DC power supply device consisting of only a linear regulator. Further, the DC power supply device 20 includes the current stabilizing circuit 21 in the pre-stage of the DC-DC converter 22. Such a configuration can restrain noise generated by the switching operation of the DC-DC converter 22 from being transmitted to the upstream power-supply cable 11. Accordingly, radiated noise leaking from the power-supply cable 11 can be reduced. Further, the DC power supply device 20 can reduce radiated noise from the power-supply line without greatly changing conversion efficiency due to change in battery voltage or making a regulator more likely to oscillate or increasing ripple current. Further, upon supply of power, the current stabilizing circuit 21 can prevent a rush current greater than a rated current from flowing into the load.

The table 1 below shows the conversion efficiencies and values of radiated noise obtained through simulations using (i) a DC power supply device consisting of only a DC-DC converter (DC-DC), (ii) a DC power supply device consisting of a DC-DC converter with a bead (DC-DC & bead), (iii) the DC power supply device in this embodiment consisting of the current stabilizing circuit 21 and the DC-DC converter 22 (DC-DC & current stabilizing circuit), and (iv) a DC power supply device consisting of only a linear regulator (LDO). The values of radiated noise indicate magnetic field intensity at a point 3 meters away from the power-supply cables. In the simulations, the power-supply cables were four-meter cables arranged parallel to each other at 0.5-mm intervals (UL Standard: AWG20), and the switching frequency was 2 MHz. Values in "difference" in Table 1 indicate relative values with respect to the efficiency and magnetic field intensity of (i) DC power supply device consisting only of a DC-DC converter. Specifications of the simulations are as follows: Vin=5 V, Vout=1.8 V, Iout=200 mA, and fsw_dcdc=2 MHz.

reduced radiated noise by more than 65 dB with a 13% efficiency decrease, thereby achieving high efficiency.

This embodiment can reduce radiated noise from the patterns and cables and therefore allows a common impedance to some extent, which has been avoided to prevent transmission of high-frequency noise within the device set. In laying parallel power-supply cables from a common power source to respective DC-DC converters provided near loads (electronic devices), lines that convey sensitive signals have to be kept away from noise-producing patterns, which results in a complicated design. According to this embodiment, management of mass-producing such complicated designs can be reduced. Further, a device set can be smaller and more stable. Still further, resistance against electromagnetic interference (EMI) can be improved without changing boards.

A system that includes various electronic devices, such as an onboard system, tends to become complicated and have an exponentially increased number of cables along with improvement of the functions. For such a system, reduction of radiated noise from cables is an urgent requirement. Using the DC power supply device in this embodiment can reduce radiated noise from power-supply cables without using large ferrite beads or parts constituting a PoC filter. This enables slim power-supply cables. Further, the DC power supply device in this embodiment can restrain noise interference due to difference in cable designs in the electronic device and therefore can improve reliability of the electronic device.

Figure 6:
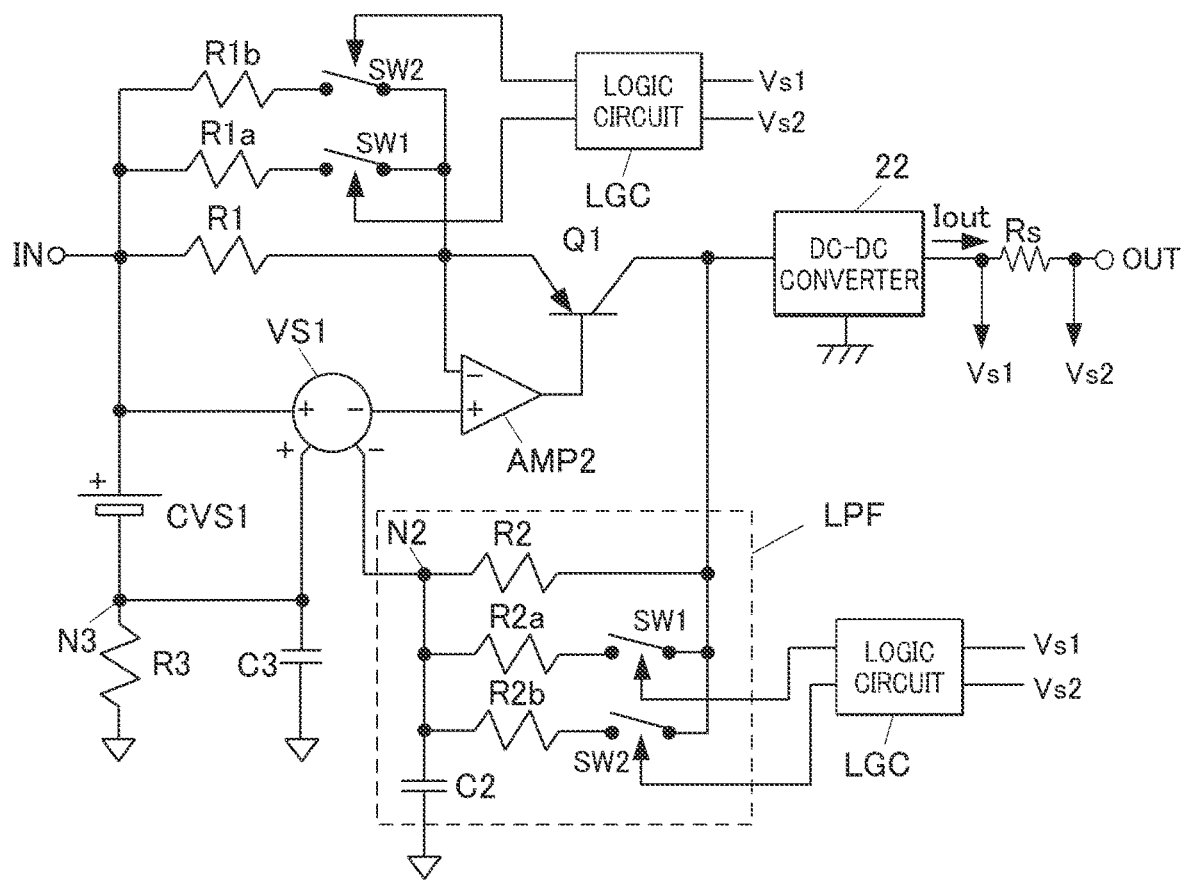
FIG. 6 shows circuit configuration of a second embodiment of the current stabilizing circuit.

The current stabilizing circuit 21 shown in FIG. 3 is effective for a system in which the fluctuation range of load current is relatively small. The current stabilizing circuit 21 may not be effective when the fluctuation range of load current increases to a certain extent. To deal with this, a current stabilizing circuit that is effective even when the fluctuation range of load current increases to a certain extent is described. More specifically, even when relatively large current flows, the current stabilizing circuit can flow constant current in response to sudden change in load (fluctuations of load current at a high frequency), whereas the current stabilizing circuit can simply serve as a resistor in response to fluctuations of load current at a relatively low frequency. FIG. 6 shows detailed circuit configuration of the current stabilizing circuit 21 having the above-described functions (second embodiment).

TABLE 1

| POWER SUPPLY DEVICE TYPE | EFFICIENCY (%) | DIFFERENCE (%) | MAGNETIC FIELD INTENSITY (dB μ A/m) | DIFFERENCE (dB μ A/m) |
| --- | --- | --- | --- | --- |
| DC-DC | 87.07 | 0 | −83.61 | 0 |
| DC-DC & BEAD | 86.95 | −0.12 | −87.23 | −3.62 |
| DC-DC & CURRENT STABILIZING CIRCUIT | 74.08 | −12.99 | −149.39 | −65.78 |
| LDO (REFERENCE) | 37.85 | −49.22 | −302.3 | −218.69 |

FIG. 5 shows the current stabilizing circuit including a bead. According to Table 1, the DC power supply device with a bead(s) and without the current stabilizing circuit reduced radiated noise by 3.62 dB, which is hardly effective. The DC power supply device consisting of only a linear regulator (LDO) reduced radiated noise by nearly 200 dB, but its efficiency decreased by nearly 50%. The DC power supply device in this embodiment, on the on the other hand, The current stabilizing circuit 21 in the second embodiment shown in FIG. 6 can adjust the resistors R1, R2 in the current stabilizing circuit in the first embodiment shown in FIG. 3. More specifically, the current stabilizing circuit 21 can additionally connect resistors R1a, R1b in parallel to the resistor R1 so as to reduce voltage drops caused by changes of the resistor R1 and avoid saturation caused by large current. The number of addable resistors is not limited to two. Further, the resistor R2 of the low-pass filter LPF is also adjusted together with the resistor R1 because the change in the resistor R1 also changes the servo band. The logic circuit LGC may have hysteresis to avoid frequently repeating switching operation when the value of load current is close to a switching threshold. Further, a current-sense resistor Rs is also connected. The current-sense resistor Rs converts the output current Iout output by the DC-DC converter 22 into voltage to generate an electric potential (switching signals) to be input to the control logic circuit.

Figure 7:
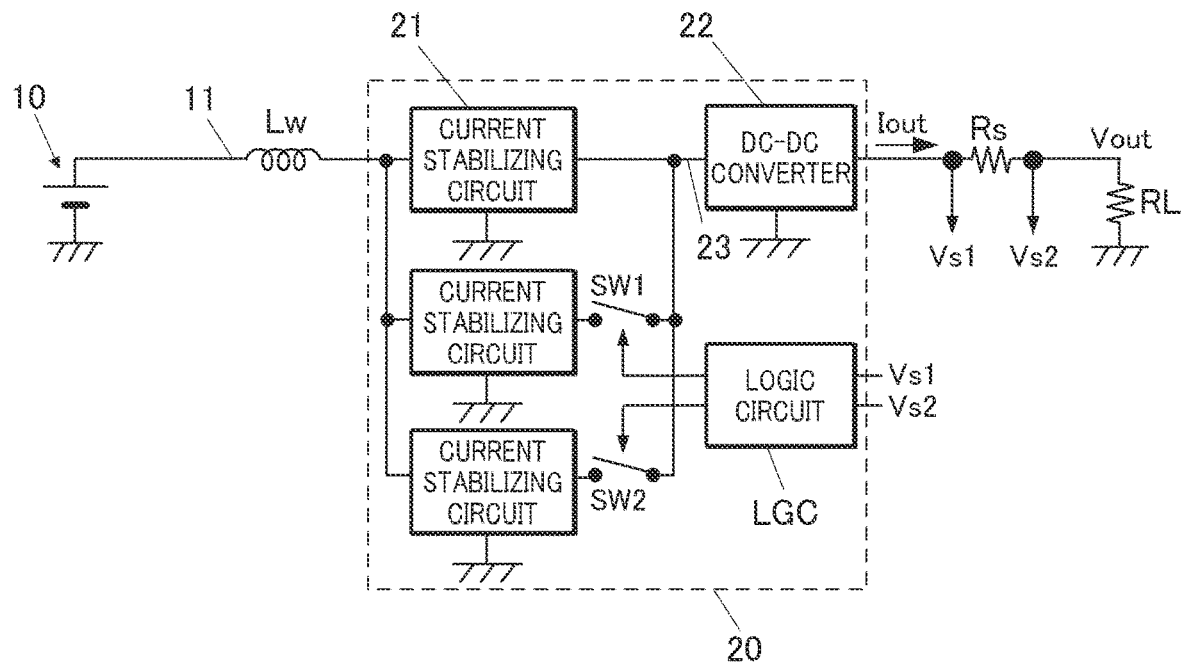
FIG. 7 shows another example of system configuration of the power supply system that includes the DC power supply device of the present invention.

Next, a third embodiment of the present invention is described. The above-described second embodiment restrains voltage drops by additionally connecting resistors in parallel to the resistor R1 using transistor switches. In such a case, however, the servo control band greatly changes and therefore needs to be under control, which complicates the circuit. To deal with this, the third embodiment includes: multiple current stabilizing circuits 21 arranged in parallel to each other; and switching elements SW1, SW2, as shown in FIG. 7. The third embodiment can increase the number of current stabilizing circuits 21 connected in parallel by switching on/off the switching elements according to output current.

A current-sense resistor Rs that converts output current Iout into voltage is also connected to generate switching signals. The logic circuit LGC may have hysteresis to avoid frequently repeating switching operation when the value of load current is close to a switching threshold. The third embodiment configured as described above can restrain voltage drops at the series resistor (resistor connected between the emitter terminal of the transistor Q1 and the current-input terminal IN) when load current increases.

Modification

Next, a modification of the DC power supply device 20 in the above embodiment is described.

Figure 8:
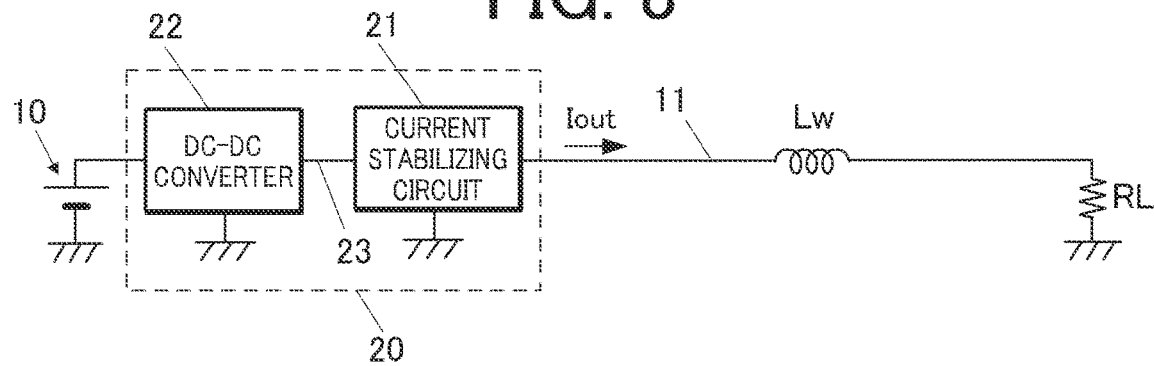
FIG. 8 shows another system configuration example of the power supply system that includes the DC power supply device of the present invention.

In the modification, the current stabilizing circuit 21 is provided in the post-stage of the DC-DC converter 22, as shown in FIG. 8.

It is generally considered preferable to place a power source near a load in an onboard system (Point-of-Load (POL) idea). Therefore, not many systems have long cables or long wiring patterns between the DC-DC converter and the load. On the other hand, there is also a need to minimize the space utilized by the system by integrating the power sources with a power management integrated circuit (IC), for example. For such a need, the power supply device shown in FIG. 8 can be effective depending on the system to which the present invention is applied.

As described above, according to an aspect of the present invention, a DC power supply device includes: a switching power supply; and a current stabilizing circuit connected in a pre-stage or a post-stage of the switching power supply, wherein the DC power supply voltage device is configured to receive an input DC voltage from a DC power source via a power-supply line, convert the input DC voltage into a different DC voltage, and output the converted DC voltage.

According to the DC power supply device configured as described above, the current stabilizing circuit connected between the switching power supply (DC-DC converter) and the power-supply line can prevent noise transmission to the power-supply line, the noise being generated by switching operation of the switching power supply. By preventing noise transmission, the DC power supply device can prevent great fluctuations of current flowing through the power-supply line and therefore restrain emission of radiated noise from the power-supply line.

Further, the DC power supply device can reduce radiated noise from the power-supply line without causing great change in efficiency due to change in battery voltage or causing a regulator to oscillate or increasing ripple current.

Preferably, the current stabilizing circuit includes: a resistor element and a transistor that are connected in series between a current-input terminal and a current-output terminal; a low-pass filter connected to the current-output terminal; and a control circuit that controls the transistor based on a potential difference between a voltage output by the low-pass filter and a voltage of a node connecting the resistor element and the transistor and that sends constant current to the transistor in response to a sudden change in load.

According to the above configuration, when load current fluctuates at a relatively high frequency, the current stabilizing circuit operates so as to keep constant current corresponding to low-frequency components of the potential difference between the upstream and the downstream. This can reduce radiated noise from the power-supply lines. On the other hand, when load current fluctuates at a relatively low frequency, the current stabilizing circuit can send current corresponding to fluctuations of the load current in the DC power supply device.

Preferably, the low-pass filter has such a time constant that cuts off a frequency component of switching operation performed by the switching power supply and passes a frequency component of servo control performed by the switching power supply.

According to the above configuration, the current stabilizing circuit can prevent noise generated by switching operation of the switching power supply from being transmitted to the power-supply line. Further, the current stabilizing circuit can send current corresponding to fluctuations of current caused by the servo control of the switching power supply.

Preferably, the control circuit includes: an operational amplifier circuit that includes a first input terminal and a second input terminal, the first input terminal receiving the voltage of the node as an input voltage; a voltage-control voltage source circuit connected between the current-input terminal and the second input terminal of the operational amplifier circuit; and a capacitor that stabilizes an electric potential of the current-input terminal, wherein the voltage-control voltage source circuit includes a pair of control terminals and generates a voltage that corresponds to a potential difference between the control terminals, an electric potential of one terminal of the control terminals is stabilized by the capacitor, and another terminal of the control terminals receives the voltage output by the low-pass filter.

According to the above configuration, the capacitor can reduce noise so as to prevent potential changes at the current input terminal-side from affecting the current sent by the current stabilizing circuit.

Preferably, the DC power supply device further includes a constant voltage source connected between the current-input terminal and the capacitor, wherein the voltage-control voltage source circuit supplies a voltage to the second input terminal of the operational amplifier circuit, based on a voltage shifted by the constant voltage source and the voltage output by the low-pass filter.

The above configuration can eliminate the time period during which the current stabilizing circuit is inactive due to a low potential difference between the emitter and collector of the transistor.

According to another aspect of the present invention, a current stabilizing circuit includes: a resistor element and a transistor that are connected in series between a current-input terminal and a current-output terminal; a low-pass filter connected to the current-output terminal; and a control circuit that controls the transistor based on a potential difference between a voltage output by the low-pass filter and a voltage of a node connecting the resistor element and the transistor and that sends constant current to the transistor in response to a sudden change in load.

The current stabilizing circuit configured as described above can restrain high-frequency noise at the current-output terminal side from being transmitted to the current-input terminal side. On the other hand, in response to the current-output terminal side having a relatively low frequency, the current stabilizing circuit can send current corresponding to a potential difference between the input side and output side.

Preferably, the control circuit includes: an operational amplifier circuit that includes a first input terminal and a second input terminal, the first input terminal receiving the voltage of the node as an input voltage; a voltage-control voltage source circuit connected between the current-input terminal and the second input terminal of the operational amplifier circuit; and a capacitor that stabilizes an electric potential of the current-input terminal, wherein the voltage-control voltage source circuit includes a pair of control terminals and generates a voltage that corresponds to a potential difference between the control terminals, an electric potential of one terminal of the control terminals is stabilized by the capacitor, and another terminal of the control terminals receives the voltage output by the low-pass filter.

According to the above configuration, the capacitor can reduce noise so as to prevent potential changes at the current input terminal-side from affecting the current sent by the current stabilizing circuit.

Preferably, the current stabilizing circuit further includes a constant voltage source connected between the current-input terminal and the capacitor, wherein the voltage-control voltage source circuit supplies a voltage to the second input terminal of the operational amplifier circuit, based on a voltage shifted by the constant voltage source and the voltage output by the low-pass filter.

The above configuration can eliminate the time period during which the current stabilizing circuit is inactive due to a low potential difference between the emitter and collector of the transistor.

Preferably, the current stabilizing circuit further includes: multiple resistor adjusters each of which includes an adjuster resistor and a switching element connected in series to the adjuster resistor; and a switcher that switches on/off switching elements each of which is the switching element to connect/disconnect the respective resistor adjusters in parallel to the resistor element, wherein according to an intensity of output current, the current stabilizing circuit changes a number of resistor adjusters connected in parallel to the resistor element.

According to another aspect of the present invention, a DC power supply device includes: a switching power supply; and multiple current stabilizing circuits connected in a pre-stage or a post-stage of the switching power supply; switching elements that connect/disconnect the respective current stabilizing circuits to the switching power supply; and a logic circuit that generates switching signals for switching on/off the switching elements, wherein the DC power supply device is configured to receive an input DC voltage from a DC power source via a power-supply line, convert the input DC voltage into a different DC voltage, and output the converted DC voltage, and according to an intensity of output current by the switching power supply, changes a number of current stabilizing circuits connected in parallel.

The DC power supply device configured as described above can prevent voltage drops due to the resistance without changing the servo control band.

Preferably, the DC power supply device further includes a current-sense resistor that is connected to an output terminal of the switching power supply and that converts the output current into a voltage, wherein the logic circuit generates the switching signals according to the voltage of the current-sense resistor.

According to the above configuration, switching signals for the switching elements can be easily generated according to the intensity of output current.

Preferably, the logic circuit has hysteresis so as not to frequently repeat switching of the switching elements in response to an intensity of load current being equal to a connection-change threshold.

The above configuration can avoid repetitive switching operation when the load current is close to the switching threshold.

According to another aspect of the present invention, there is provided a method for reducing radiated noise output from a power-supply line of a DC power supply system, the DC power supply system including a switching power supply and being configured to convert an input DC voltage supplied by a DC power source via the power-supply line into a different DC voltage and output the converted DC voltage to a load. The method includes regulating current that flows to the switching power supply via the power-supply line by using a current stabilizing circuit so as to restrain noise caused by switching operation of the switching power supply from being transmitted to the power-supply line.

According to the above method, release of radiated noise from the power-supply lines can be prevented.

According to the DC power supply device, the current stabilizing circuit used in the DC power supply device, and the method of reducing noise from power-supply lines, radiated noise from the power-supply lines can be reduced in a system that supplies DC voltage from the battery to the load via relatively long power-supply lines (power-supply cables). Further, the radiated noise from the power-supply lines can be reduced without greatly changing conversion efficiency owing to changes in battery voltage or causing a regulator to oscillate or increasing ripple current.

Although the embodiments of the present invention have been described in detail, the embodiments do not limit the present invention. For example, although the bipolar transistor is used as the transistor constituting the current stabilizing circuit 21 in the above embodiments, a MOS transistor may be used instead. Further, although in the embodiments the present invention is applied to a DC power supply device that uses a synchronous rectifying-type DC-DC converter as the DC-DC converter 22, the present invention is also applicable to a DC power supply device that uses a nonsynchronous rectifying-type DC-DC converter with a diode instead of the switching transistor M2 in FIG. 2.

Further, although the embodiment shown in FIG. 2 is the voltage-mode control DC-DC converter, a DC-DC converter may be a current-mode control or hysteretic control DC-DC converter.

Further, in the above embodiments, the present invention is applied to a system that uses a non-isolated DC-DC converter in the DC power supply device. The present invention is also applicable to a system that includes a transformer and an isolated DC-DC converter in the DC power supply device, where the isolated DC-DC converter performs switching control of current applied to the primary coil of the transformer.

Further, in the above embodiments, the power supply system uses power-supply cables as power-supply lines that supply power-supply voltage from the battery to the load. The present invention is also applicable to a system that uses wiring patterns formed on a board (e.g., printed circuit board) as power-supply lines to supply power-supply voltage to the load.

Figure 9:
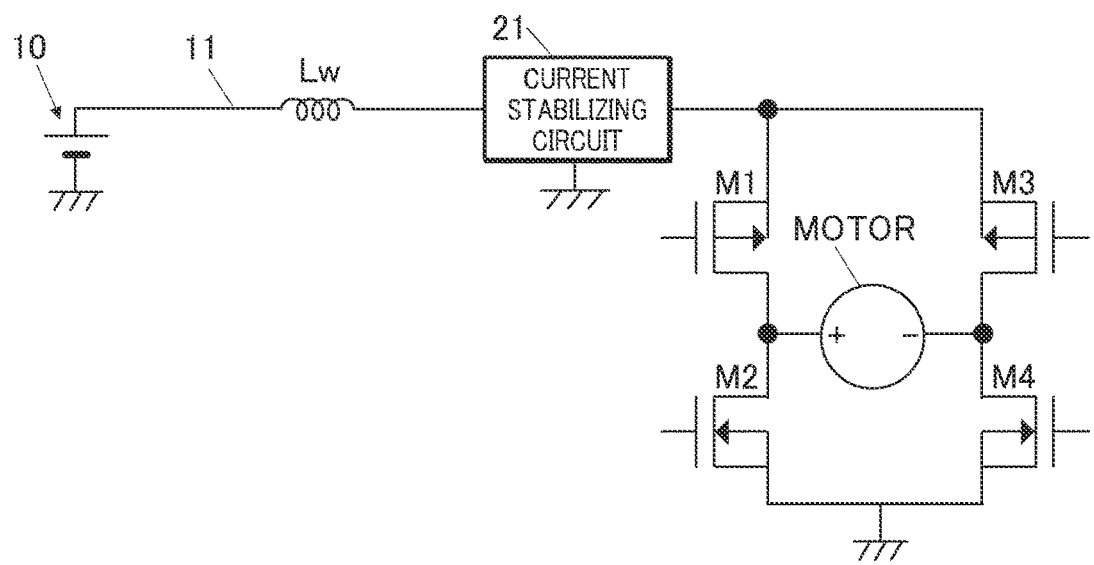
FIG. 9 shows an example of circuit configuration of a motor drive circuit to which the current stabilizing circuit is applied.

The current stabilizing circuit 21 of the present invention is effective for any system in which current greatly fluctuates due to switching operation. For example, the present invention is applicable to a system shown in FIG. 9 in order to reduce radiated noise from power-supply cables that supply power to switching-type motor drivers M1 to M4. The present invention is also applicable for noise reduction of power-supply cables that supply power to a D-class amplifier.

What is claimed is:

1. A DC power supply device comprising:
    a switching power supply; and
    a current stabilizing circuit connected in a pre-stage or a post-stage of the switching power supply,
    wherein the DC power supply device is configured to receive an input DC voltage from a DC power source via a power-supply line, convert the input DC voltage into a different DC voltage, and output the converted DC voltage,
    wherein the current stabilizing circuit includes:
    a resistor element and a transistor that are connected in series between a current-input terminal and a current-output terminal;
    a low-pass filter connected to the current-output terminal; and
    a control circuit that controls the transistor based on a potential difference between a voltage output by the low-pass filter and a voltage of a node connected between the resistor element and the transistor and that sends constant current to the transistor in response to a sudden change in load, and
    wherein the low-pass filter has a time constant that cuts off a frequency component of a switching operation performed by the switching power supply and passes a frequency component of servo control performed by the switching power supply.

2. The DC power supply device according to claim 1, wherein the control circuit includes:
    an operational amplifier circuit that includes a first input terminal and a second input terminal, the first input terminal receiving the voltage of the node as an input voltage;
    a voltage-control voltage source circuit connected between the current-input terminal and the second input terminal of the operational amplifier circuit; and
    a capacitor that stabilizes an electric potential of the current-input terminal,
    wherein:
    the voltage-control voltage source circuit includes a pair of control terminals and generates a voltage that corresponds to a potential difference between the control terminals,
    an electric potential of one terminal of the control terminals is stabilized by the capacitor, and
    another terminal of the control terminals receives the voltage output by the low-pass filter.

3. The DC power supply device according to claim 2, further comprising a constant voltage source connected between the current-input terminal and the capacitor,
    wherein the voltage-control voltage source circuit supplies a voltage to the second input terminal of the operational amplifier circuit, based on a voltage shifted by the constant voltage source and the voltage output by the low-pass filter.

4. A current stabilizing circuit comprising:
    a resistor element and a transistor that are connected in series between a current-input terminal and a current-output terminal;
    a low-pass filter connected to the current-output terminal; and
    a control circuit that controls the transistor based on a potential difference between a voltage output by the low-pass filter and a voltage of a node connecting the resistor element and the transistor and that sends constant current to the transistor in response to a sudden change in load,
    wherein the control circuit includes:
    an operational amplifier circuit that includes a first input terminal and a second input terminal, the first input terminal receiving the voltage of the node as an input voltage;
    a voltage-control voltage source circuit connected between the current-input terminal and the second input terminal of the operational amplifier circuit; and
    a capacitor that stabilizes an electric potential of the current-input terminal,
    wherein:
    the voltage-control voltage source circuit includes a pair of control terminals and generates a voltage that corresponds to a potential difference between the control terminals,
    an electric potential of one terminal of the control terminals is stabilized by the capacitor, and
    another terminal of the control terminals receives the voltage output by the low-pass filter.

5. The current stabilizing circuit according to claim 4, further comprising a constant voltage source connected between the current-input terminal and the capacitor,
    wherein the voltage-control voltage source circuit supplies a voltage to the second input terminal of the operational amplifier circuit, based on a voltage shifted by the constant voltage source and the voltage output by the low-pass filter.

6. The current stabilizing circuit according to claim 5, further comprising:
    multiple resistor adjusters each of which includes an adjuster resistor and a switching element connected in series to the adjuster resistor; and
    a switcher that switches on/off switching elements each of which is the switching element to connect/disconnect the respective resistor adjusters in parallel to the resistor element,
    wherein according to an intensity of output current, the current stabilizing circuit changes a number of resistor adjusters connected in parallel to the resistor element.

7. A DC power supply device comprising:
a switching power supply; and
multiple current stabilizing circuits each of which is the current stabilizing circuit according to claim 6 connected in a pre-stage or a post-stage of the switching power supply;
switching elements that connect/disconnect the respective current stabilizing circuits to the switching power supply; and
a logic circuit that generates switching signals for switching on/off the switching elements,
wherein:
the DC power supply device is configured to receive an input DC voltage from a DC power source via a power-supply line, convert the input DC voltage into a different DC voltage, and output the converted DC voltage, and
according to an intensity of output current by the switching power supply, changes a number of current stabilizing circuits connected in parallel.

8. The DC power supply device according to claim 7, further comprising a current-sense resistor that is connected to an output terminal of the switching power supply and that converts the output current into a voltage, wherein the logic circuit generates the switching signals according to the voltage of the current-sense resistor.

9. The DC power supply device according to claim 8, wherein the logic circuit has hysteresis so as not to frequently repeat switching of the switching elements in response to an intensity of load current being equal to a switching threshold.

10. A method for reducing radiated noise output from a power-supply line of a DC power supply system, the DC power supply system including a switching power supply and being configured to convert an input DC voltage supplied by a DC power source via the power-supply line into a different DC voltage and output the converted DC voltage to a load, the method comprising:
regulating current that flows to the switching power supply via the power-supply line by using a current stabilizing circuit so as to restrain noise caused by switching operation of the switching power supply from being transmitted to the power-supply line,
wherein the current stabilizing circuit includes:
a resistor element and a transistor that are connected in series between a current-input terminal and a current-output terminal;
a low-pass filter connected to the current-output terminal; and
a control circuit that controls the transistor based on a potential difference between a voltage output by the low-pass filter and a voltage of a node connected between the resistor element and the transistor and that sends constant current to the transistor in response to a sudden change in the load, and
wherein the low-pass filter has a time constant that cuts off a frequency component of a switching operation performed by the switching power supply and passes a frequency component of servo control performed by the switching power supply.

* * * * *